US011728777B2

(12) United States Patent
Hardy et al.

(10) Patent No.: US 11,728,777 B2
(45) Date of Patent: Aug. 15, 2023

(54) RF POWER SOURCE WITH IMPROVED GALVANIC ISOLATION

(71) Applicant: Aethera Technologies Limited, Halifax (CA)

(72) Inventors: Tim Hardy, Halifax (CA); Brian Walker, Halifax (CA); Kirk Zwicker, Halifax (CA); Charles Schue, Halifax (CA)

(73) Assignee: AETHERA TECHNOLOGIES LIMITED, Halifax (CA)

( * ) Notice: Subject to any disclaimer, the term of this patent is extended or adjusted under 35 U.S.C. 154(b) by 173 days.

(21) Appl. No.: 17/326,994

(22) Filed: May 21, 2021

(65) Prior Publication Data

US 2021/0384877 A1 Dec. 9, 2021

Related U.S. Application Data

(60) Provisional application No. 63/034,647, filed on Jun. 4, 2020.

(51) Int. Cl.
*H03F 3/24* (2006.01)
*H03F 3/217* (2006.01)
*H04B 1/04* (2006.01)

(52) U.S. Cl.
CPC .......... *H03F 3/245* (2013.01); *H03F 3/2176* (2013.01); *H04B 1/04* (2013.01); *H03F 2200/451* (2013.01); *H03F 2200/459* (2013.01)

(58) Field of Classification Search
CPC .. H03F 3/245; H03F 3/2176; H03F 2200/451; H03F 2200/459; H04B 1/04

(Continued)

(56) References Cited

U.S. PATENT DOCUMENTS 2,903,518 A 9/1959 Kahn
3,919,656 A 11/1975 Sokal et al.
(Continued)

FOREIGN PATENT DOCUMENTS

| EP | 2602925 A1 | 6/2013 |
|---|---|---|
| WO | 99/41827 A1 | 8/1999 |
| WO | 2017/127856 A1 | 8/2017 |

OTHER PUBLICATIONS

International Search Report and Written Opinion issued in connection with International Application No. PCT/CA2021/050695, International Searching Authority, dated Oct. 15, 2021.

*Primary Examiner* — Kevin M Burd
(74) *Attorney, Agent, or Firm* — Dentons Canada LLP

(57) ABSTRACT

Disclosed is an RF (Radio Frequency) power source having a power supply configured to convert an AC (Alternating Current) voltage at a power supply input to a second voltage at a power supply output, and an RF generator configured to receive the second voltage at an RF generator input and to use the second voltage to produce an output RF signal at an RF generator output. According to an embodiment of the disclosure, the power supply performs the voltage conversion without galvanic isolation between the power supply input and the power supply output, which can increase energy efficiency while reducing complexity and cost as well. Instead, the RF generator is provided with galvanic isolation between the RF generator input and the RF generator output, which can be sufficient for achieving galvanic isolation between the power supply input and the RF generator output for safety reasons.

20 Claims, 10 Drawing Sheets

(58) Field of Classification Search
USPC .......................................................... 375/295
See application file for complete search history.

(56) References Cited

U.S. PATENT DOCUMENTS

| | | | |
|---|---|---|---|
| 4,580,111 A | 4/1986 | Swanson | |
| 7,692,936 B2* | 4/2010 | Richter | H02M 7/537 |
| | | | 363/56.05 |
| 10,305,306 B1* | 5/2019 | Wardell | H02J 7/342 |
| 2008/0013352 A1* | 1/2008 | Baker | H02M 1/4216 |
| | | | 363/125 |
| 2018/0368905 A1* | 12/2018 | Latterell | A61B 18/042 |

\* cited by examiner

RF POWER SOURCE WITH IMPROVED GALVANIC ISOLATION

RELATED APPLICATION

This patent application claims priority to U.S. Provisional Patent Application No. 63/034,647 filed on Jun. 4, 2020, the entire disclosure of which is incorporated by reference.

FIELD OF THE DISCLOSURE

This disclosure relates to electronics, and more particularly to RF (Radio Frequency) power sources.

BACKGROUND

An RF power source is a device that converts energy from a low frequency or DC (Direct Current) electrical power source, usually from an AC (Alternating Current) power grid, to RF energy. There are many possible applications. In the case of a transmitter, RF energy can be used for communications. In the case of an RF power generator, RF energy can be used for other purposes such as heating, drying or producing plasma.

For safety reasons, any conductor or component directly connected to AC utility mains (i.e. wiring which is a source of electrical energy in a building) must be isolated from users or other equipment not designed to be AC connected. Galvanic isolation refers to a high standard of electrical insulation that prevents flow of current from the AC utility mains to the users and the other equipment under strenuous conditions. Unfortunately, galvanic isolation can introduce power inefficiencies.

RF power sources must provide galvanic isolation for safety reasons. However, RF power sources, especially when used for high power applications, should also be as energy efficient as possible to reduce operating cost and harm to the environment. It is desirable to provide an RF power source with improved energy efficiency while still providing galvanic isolation for safety reasons.

SUMMARY OF THE DISCLOSURE

Disclosed is an RF power source having a power supply configured to convert an AC voltage at a power supply input to a second voltage at a power supply output, and an RF generator configured to receive the second voltage at an RF generator input and to use the second voltage to produce an output RF signal at an RF generator output. In some implementations, the second voltage is a DC voltage.

According to an embodiment of the disclosure, the power supply performs the voltage conversion without galvanic isolation between the power supply input and the power supply output, which can increase energy efficiency while reducing complexity and cost as well. Instead, the RF generator is provided with galvanic isolation between the RF generator input and the RF generator output, which can be sufficient for achieving galvanic isolation between the power supply input and the RF generator output for safety reasons.

In some implementations, the RF power source allows for increased energy efficiency while reducing complexity and cost through the utilization of an RF power architecture with a non-isolated power supply. Energy inefficiencies, complexity, and costs associated with galvanic isolation between the power supply input and the power supply output can be avoided or mitigated. While the galvanic isolation between the RF generator input and the RF generator output can reduce energy efficiency, such reduction is relatively small and outweighed by a relatively large gain in energy efficiency by omitting the galvanic isolation between the power supply input and the power supply output. In this way, the RF power source can have improved energy efficiency while still providing galvanic isolation for safety reasons.

In some implementations, the RF generator has multiple RF power amplifiers each configured to use the second voltage to produce an individual RF signal, and a power combiner configured to combine each individual RF signal to produce the output RF signal. In this way, it is possible to achieve high power output via the multiple RF power amplifiers, which is suitable for high power applications, while still achieving the aforementioned advantages of the non-isolated power supply.

In some implementations, the AC voltage is a three-phase AC voltage, the second voltage is a DC voltage, and the power supply has a rectifier circuit for converting the three-phase AC voltage to the DC voltage. The rectifier circuit can for example include a six-pulse rectifier. In this way, it is possible to provide high energy efficiency for the power supply while still achieving the galvanic isolation for safety reasons via the RF generator.

Other aspects and features of the present disclosure will become apparent, to those ordinarily skilled in the art, upon review of the following description of the various embodiments of the disclosure.

BRIEF DESCRIPTION OF THE DRAWINGS

Embodiments will now be described with reference to the attached drawings in which.

DETAILED DESCRIPTION OF EMBODIMENTS

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementa-

Introduction

Figure 1:
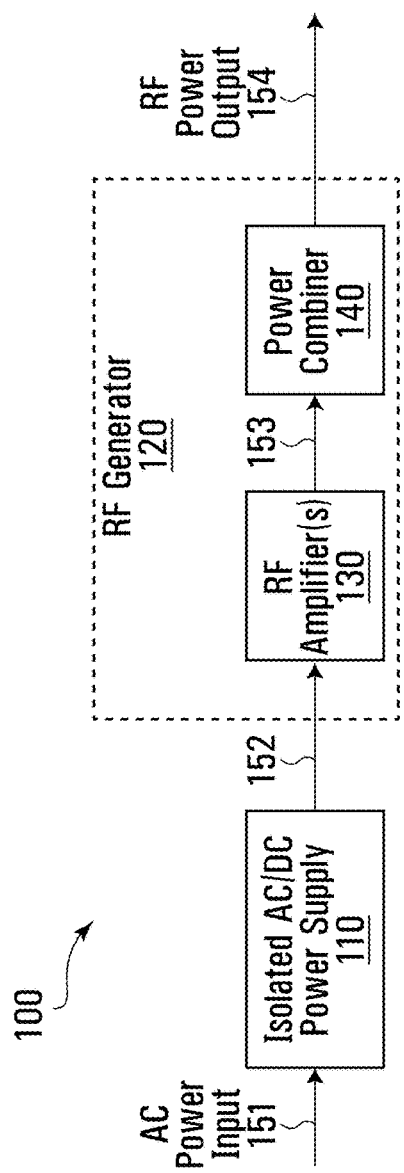
FIG. 1 is a block diagram of an RF power source having an isolated power supply and an RF generator.

Referring first to FIG. 1, shown is a block diagram of an RF power source 100 having an isolated power supply 110 and an RF generator 120. In some implementations, as shown in the illustrated example, the RF generator 120 has one or more RF power amplifiers 130, a power combiner 140, and may have other components that are not specifically shown.

In some implementations, the RF power amplifiers 130 use DC voltage. Because power is generally distributed by electric power utilities using AC power, the isolated power supply 110 converts AC voltage at a power supply input 151 to DC voltage at a power supply output 152. In doing so, the isolated power supply 110 provides galvanic isolation between the power supply input 151 and the power supply output 152. This galvanic isolation is provided for safety reasons, for example to avoid or mitigate a voltage spike at the power supply input 151 from propagating through the RF power source 100. In some implementations, the isolated power supply 110 has three stages (not shown) including an inverter, a transformer, and a rectifier, and the galvanic isolation is provided by the transformer.

The RF generator 120 receives the DC voltage at an RF generator input 152 and uses the DC voltage to produce an output RF signal at an RF generator output 154. In some implementations, the RF generator 120 has multiple RF power amplifiers 130. In high power RF applications, RF power amplifiers 130 are limited in terms of maximum power capability, and hence multiple RF power amplifiers 130 can be used to produce more power. An RF power output 153 of the multiple RF power amplifiers 130 can be combined to produce a single output 154 using the power combiner 140.

Galvanic isolation is a principle of isolating functional sections of electrical systems to limit current flow, such that no direct conduction path is permitted. There are many ways to provide the galvanic isolation between the power supply input and the power supply output. In some implementations, the galvanic isolation is provided by a transformer (not shown), such that electrical energy is transferred between separate coils via induction without a direct conduction path. However, other implementations are possible. In general, galvanic isolation can be provided by capacitance using an electric field, induction using a magnetic field, or by optical, acoustic or mechanical means. There are many types and embodiments of isolated power supplies which might be used. Unfortunately, the galvanic isolation (e.g. using a transformer) tends to introduce significant energy inefficiencies, in addition to increasing complexity and cost. Thus, the RF power source 100 of FIG. 1 leaves much to be desired.

As noted above, galvanic isolation is provided between the power supply output 152 and the power supply input 151. Therefore, galvanic isolation between the RF generator input 152 and the RF generator output 154 is not needed. In this regard, the RF power amplifiers 130 and the power combiner 140 that form the RF generator 120 may not need to provide any galvanic isolation, or may provide only a low grade of insulation.

Improved RF Power Source

Figure 2:
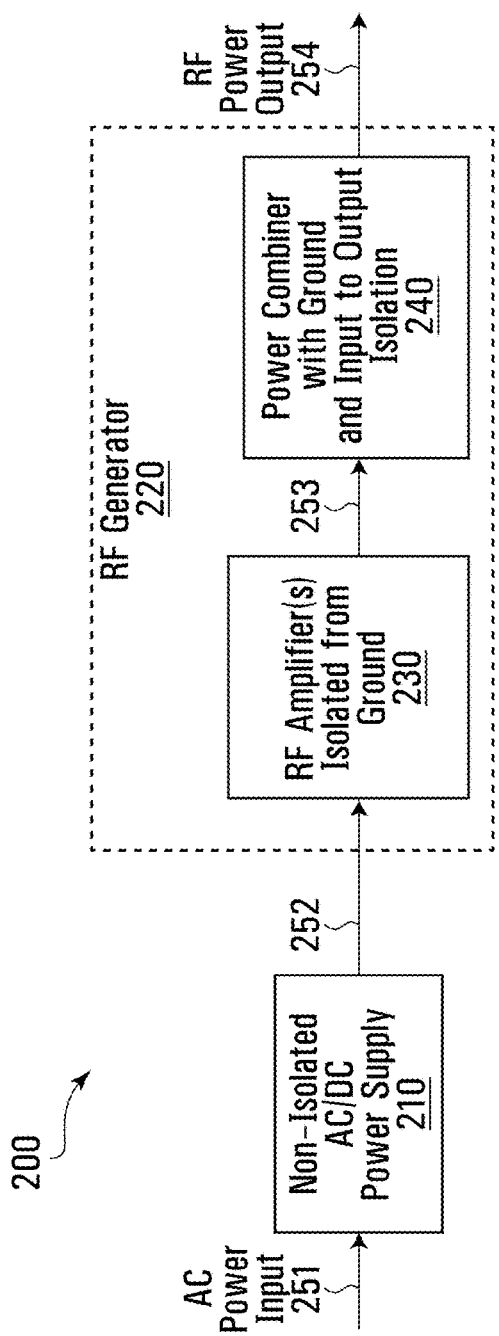
FIG. 2 is a block diagram of an RF power source having a non-isolated power supply and an isolated RF generator.

Referring now to FIG. 2, shown is a block diagram of an RF power source 220 having a non-isolated power supply 210 and an isolated RF generator 220. During operation, the non-isolated power supply 210 converts an AC voltage at a power supply input 251 to a second voltage at a power supply output 252. In some implementations, the second voltage is a DC voltage, but other implementations are possible in which the second voltage is a low-frequency voltage. The RF generator 220 receives the second voltage at an RF generator input 252 and uses the second voltage to produce an output RF signal at an RF generator output 254.

According to an embodiment of the disclosure, the non-isolated power supply 210 performs the voltage conversion without galvanic isolation between the power supply input 251 and the power supply output 252, which can increase energy efficiency while reducing complexity and cost as well. Instead, the RF generator 220 is provided with galvanic isolation between the RF generator input 252 and the RF generator output 254, which can be sufficient for achieving galvanic isolation between the power supply input 251 and the RF generator output 254 for safety reasons. It is noted that the non-isolated power supply 210 may have galvanic isolation of its AC input terminals and DC output terminals (+ and −) from other circuits and surfaces. However, its AC input terminals and DC output terminals are not galvanically isolated from each other.

In some implementations, the RF power source 220 allows for increased energy efficiency while reducing complexity and cost through the utilization of an RF power architecture with a non-isolated power supply 210. Energy inefficiencies, complexity, and costs associated with galvanic isolation between the power supply input 251 and the power supply output 252 can be avoided or mitigated. While the galvanic isolation between the RF generator input 252 and the RF generator output 254 can reduce energy efficiency, such reduction is relatively small and outweighed by a relatively large gain in energy efficiency by omitting the galvanic isolation between the power supply input 251 and the power supply output 252. In this way, the RF power source 220 of FIG. 2 can have improved energy efficiency compared to the RF power source 100 of FIG. 1 while still providing galvanic isolation for safety reasons.

It is noted that RF energy is already suitable for transmission through a transformer. Therefore, in some implementations, the galvanic isolation between the RF generator input 252 and the RF generator output 254 is provided by an RF transformer (not shown), which enables transmission of RF energy to be performed efficiently, especially when compared to transmission of energy by a transformer of an isolated power supply. Note that DC voltage and other low frequency voltages do not transmit well through a transformer. Thus, as noted above, an isolated power supply may have three stages (i.e. an inverter, a transformer, and a rectifier), so that the transformer can provide galvanic isolation at a stage prior to when AC voltage is rectified into DC voltage.

There are many possibilities for the RF generator 220. In some implementations, as shown in the illustrated example, the RF generator 220 has one or more RF power amplifiers 230, a power combiner 240 with galvanic isolation, and may have other components that are not specifically shown. In some implementations, the RF generator 220 has multiple RF power amplifiers each configured to use the second voltage from the power supply output 252 to produce an individual RF signal at an RF power output 253, and the power combiner 240 combines each individual RF signal to produce the output RF signal at the RF generator output 254. In this way, it is possible to achieve high power output via the multiple RF power amplifiers 230, which is suitable for high power applications, while still achieving the advantages of the non-isolated power supply 210.

There are many possibilities for the power supply, especially since galvanic isolation is not needed between the power supply output and the power supply input. In some implementations, the AC voltage is a three-phase AC voltage, the second voltage is a DC voltage, and the power supply has a rectifier circuit for converting the three-phase AC voltage to the DC voltage. The rectifier circuit can for example include a six-pulse rectifier. In this way, it is possible to provide high energy efficiency for the power supply while still achieving the galvanic isolation for safety reasons via the RF generator 220. Further example details of the power supply 200 are described below with reference to FIG. 3 and FIG. 4.

For safety reasons, a device which is connected to the AC mains should be isolated from conductive equipment or surfaces with which a person could possibly come into contact. Additionally, the output of such a device, potentially a power supply, might also be isolated from an input which is connected to the AC mains. If the output is isolated from the input, then downstream equipment may not need isolation or may only need a lower grade of insulation. This is referred to as an "isolated power supply". Alternately a "non-isolated power supply" which is connected to the AC mains would be isolated from grounded surfaces, but its output would not be isolated from its input. When a non-isolated power supply is used, the downstream equipment should be isolated to a high standard and should have input to output isolation.

Galvanic isolation is provided between the RF generator input 252 and the RF generator output 254. In some implementations, the galvanic isolation is provided by the power combiner 240 being an isolated combiner (i.e. power combiner input terminals 253 are galvanically isolated from power combiner output terminals 254). Examples are described below with reference to FIG. 3 and FIG. 4. In other implementations, the galvanic isolation is provided by each RF power amplifier 230 being an isolated RF power amplifier. Examples of isolated RF power amplifiers are described below with reference to FIG. 6 and FIG. 7. In other implementations, the galvanic isolation is provided by both (i) the power combiner 240 being an isolated combiner and (ii) each RF power amplifier 230 being an isolated RF power amplifier.

For implementations in which galvanic isolation between the RF generator input 252 and the RF generator output 254 is provided by the power combiner 240 being an isolated combiner, there is no need for each RF power amplifier 230 to provide galvanic isolation between its DC input terminals 252 and RF output terminals 253. Nonetheless, each RF power amplifier 230 may have DC input terminals 252 (+ and −) and RF output terminals 253 which are galvanically isolated from other surfaces and connections including control and monitoring connections.

The examples described herein focus on multiple RF power amplifiers 230. However, in other implementations, the RF generator 220 has a single RF power amplifier 230. In some implementations, the galvanic isolation between the RF generator input 252 and the RF generator output 254 can be provided by the single RF power amplifier 230 being an isolated RF power amplifier. For implementations involving a single isolated RF power amplifier 230, there may be no need for the power combiner 240. Thus, the power combiner 240 may be omitted or it may be of a non-isolating type.

There are many possibilities for the RF power amplifiers 230. In some implementations, the RF power amplifiers 230 are Class-D amplifiers suitable for high power efficiency. However, other amplifiers are possible. For instance, in other implementations, the one or more isolated RF power amplifiers 230 are Class-E amplifiers or Class-F amplifiers. Example RF power amplifiers are described later with reference to FIG. 5 to FIG. 7.

Example RF Power Sources

Figure 3:
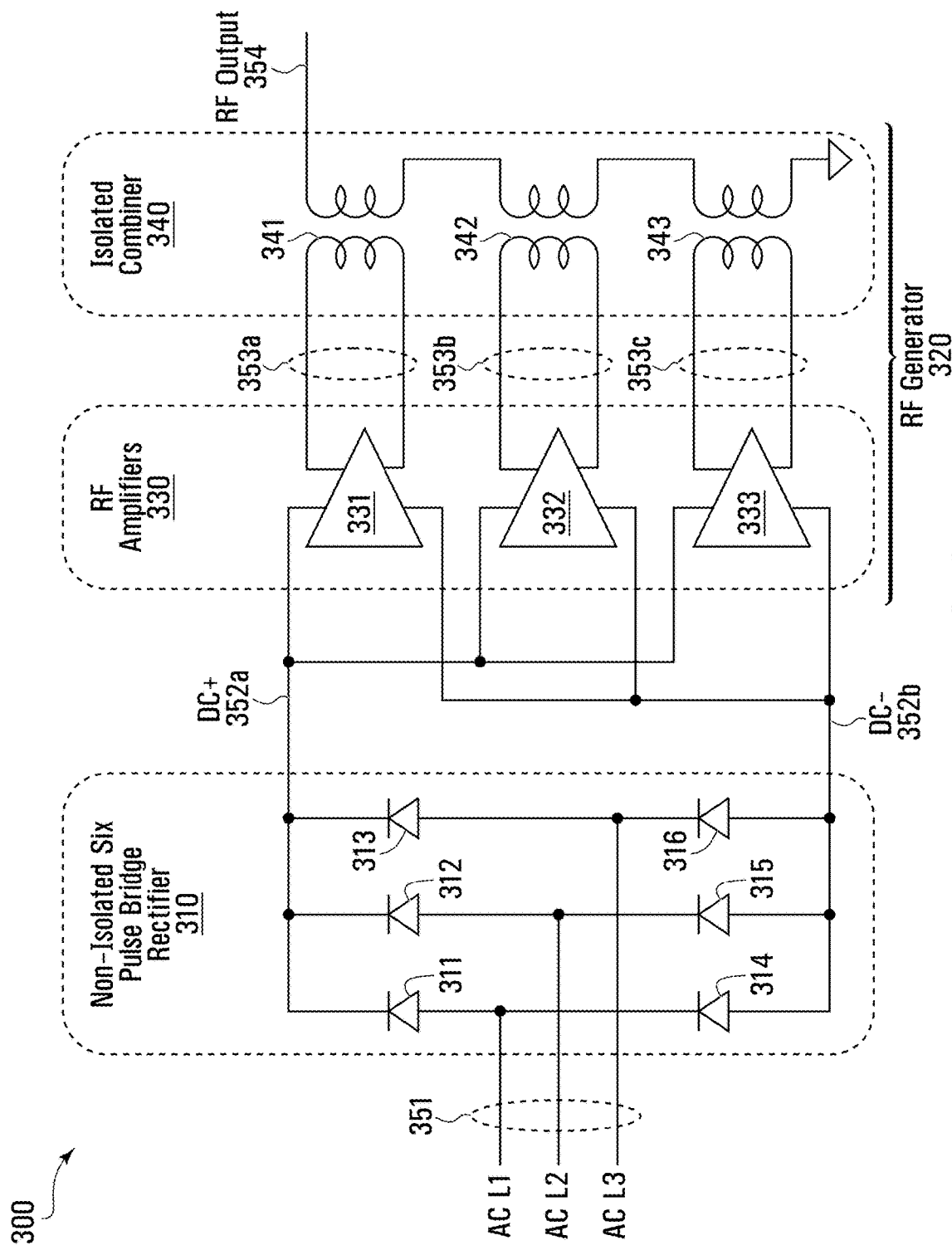
FIG. 3 is a circuit diagram of another RF power source having a non-isolated power supply and an isolated RF generator.

Referring now to FIG. 3, shown is a circuit diagram of another RF power source 300 having a non-isolated power supply 310 and an isolated RF generator 320. The RF generator 320 has RF power amplifiers 330 and a power combiner 340 that combines individual RF signals from the RF power amplifiers 330. In the illustrated example, the RF power amplifiers 330 include three RF power amplifiers 331-333, although any suitable number of RF power amplifiers can be used.

There are many possibilities for the power combiner 340. In some implementations, the power combiner 340 utilizes RF transformers 341-343 to combine the power of the RF power amplifiers 331-333. In specific implementations, as shown in the illustrated example, the isolated combiner 340 has, for each RF power amplifier 331-333, a corresponding RF transformer 341-343 with input terminals 353a-353c for receiving the individual RF signal from the RF power amplifier 331-333, such that a series connection of the RF transformers 341-343 combines the individual RF signals 353a-353c from the input terminals 353a-353c to produce the output RF signal 354. Other implementations are possible. The RF transformers 341-343 provide galvanic isolation between the RF generator input 352a-352b and the RF generator output 354, such that galvanic isolation is not needed between the power supply output 352a-352b and the power supply input 351. Note that input terminals 353a-353c of the power combiner 340 should also be galvanically isolated from grounded surfaces as well.

The galvanic isolation between the RF generator input 352a-352b and the RF generator output 354 is provided for the function of the RF generator 320. Using the power combiner 340 of FIG. 3 as an example, the RF transformers 341-343 inherently have isolation to function properly. The insulation used to achieve isolation in this case is referred to as 'functional insulation'. However, because the galvanic isolation provided by the RF generator 320 is intended to protect users who might come in contact with the RF power source 300, the insulation used to achieve galvanic isolation should be held to a higher standard and is considered 'protective insulation'. The standard of insulation to protect users varies by application and may be of different grades including Reinforced, Supplementary or Double Insulation. However, in all of these grades, the standard is higher than the standard used for functional insulation.

Insulation used for protection in the RF generator 320, in the case of a non-isolated power supply, should perform better than insulation used for purely functional purposes in the case of an isolated power supply. The performance of insulation is usually considered in terms of its dimensions with respect to creepage and clearance as well as its performance during voltage testing especially used for assessment of solid insulation. Solid insulation is the insulation not composed of a gas (e.g. air) or a liquid. Clearance is the space between conductors, not through a solid, and creepage is the distance between conductors across the surface of solid insulators. In the case of clearance, where insulation is to be protective (in the case of the present disclosure), depending on the voltage and standards used, the clearance may involve an increase from 1.3 mm (for functional insulation) to 7.1 mm (for protective insulation), for example. For solid insulation, voltage testing can be performed to determine suitability for protective insulation. For example, an impulse withstand test of 5000V and AC test voltage of 2900V can be performed where there is no special testing for functional insulation.

There are many possibilities for the power supply 310, especially since galvanic isolation is not needed between the power supply output and the power supply input. In some implementations, the power supply 310 includes a rectifier circuit 311-316 for converting a three-phase AC voltage to a DC voltage. In specific implementations, the rectifier circuit includes a six-pulse rectifier 311-316 as shown in the illustrated example. In specific implementations, the rectifier circuit 311-316 is a diode rectifier 311-316. Such implementations can have relatively high efficiency while having relatively low complexity and cost as well. Also, such implementations can have relatively high reliability, and may be suitable for use in an RF power generator for heating and drying applications. While an isolated power supply may have three stages (i.e. an inverter, a transformer, and a rectifier) as described above, the power supply 310 shown in FIG. 3 is comparatively simple and does not need an inverter or a transformer.

The diode rectifier 311-316 as shown in the illustrated example has a relatively simple design and does not need any control system to turn on/off any active devices. However, other implementations are possible in which active switches such as IGBTs (Insulated Gate Bipolar Transistors) or MOSFETs (Metal Oxide Field Effect Transistors) are used with an active control system. For example, some or all of the diodes 311-316 can be replaced with thyristors or transistors with suitable control circuitry. Also, while the illustrated example focuses on a six-pulse bridge rectifier 311-316, it is noted that any number of bridge rectifiers can be used. For example, another implementation employs a twelve-pulse bridge rectifier. The number of bridges is implementation-specific.

While the rectifier circuit 311-316 is shown to convert a three-phase AC voltage at the power supply input 351 to a DC voltage at the power supply output 352a-352b, in other implementations a rectifier circuit is provided to convert a single phase AC voltage to a DC voltage. For such implementations, the power supply 310 can include a single phase bridge rectifier (not shown). Also, while the rectifier circuit 311-316 is shown as a full-wave rectifier 311-316, in other implementations a half-wave rectifier circuit (not shown) is provided to convert an AC voltage (either single phase or three phase) to a DC voltage. Also, other possible implementations can include PFC (Power Factor Correction) rectifiers which include three-phase types (e.g. a Vienna rectifier) and single-phase types (e.g. buck and boost topologies as well as topologies with and without diode bridges). Other implementations are possible.

Figure 4:
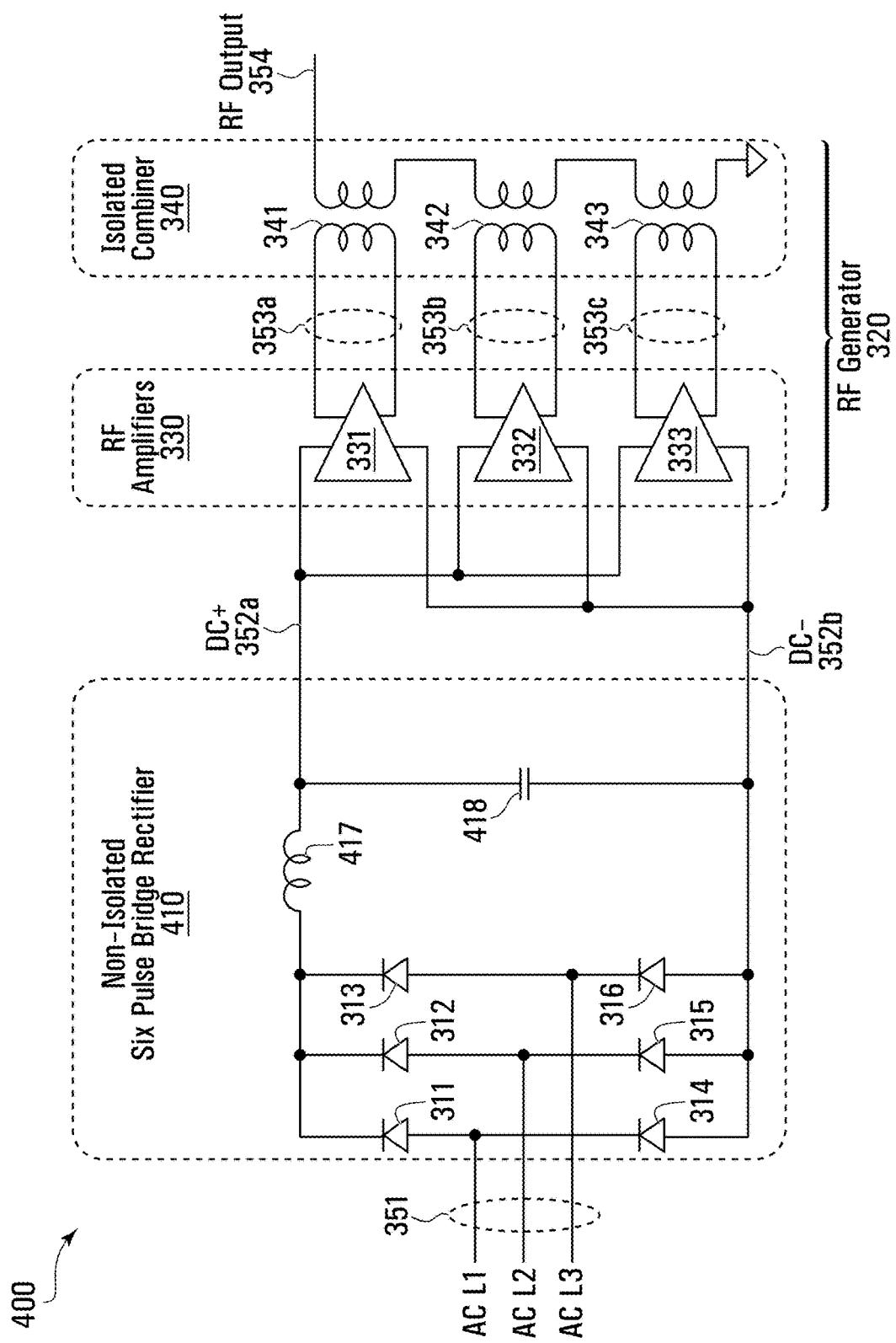
FIG. 4 is a circuit diagram of another RF power source having a non-isolated power supply and an isolated RF generator.

Referring now to FIG. 4, shown is a circuit diagram of another RF power source 400 having a non-isolated power supply 410 and an isolated RF generator 320. The RF power source 400 of FIG. 4 is identical to the RF power source 300 of FIG. 3, except that a filter 417-418 has been added to the power supply 410 to reduce ripple voltage at the power supply output 352a-352b. There are many possibilities for the filter 417-418. In some implementations, as shown in the illustrated example, the filter 417-418 is an LC filter 417-418, including an inductor 417 and a capacitor 418. Such implementations may be preferred for a high power radio transmitter using PSM (Pulse Step Modulation) or PDM (Pulse Duration Modulation) if the RF amplifiers 330 include a PDM modulator. See for example U.S. Pat. No. 2,903,518. Other implementations are possible for the filter.

Much like the RF power source 300 of FIG. 3, the number of RF power amplifiers 330 is implementation-specific. In specific implementations, there are eight RF power amplifiers 331-333 (only three shown). However, other implementations are possible. In some implementations, the RF power source 400 has control circuitry (now shown) to individually enable or disable each RF power amplifier 331-333. This can be done to adjust power output depending on an application. In some implementations, the control circuitry provides for a modulation technique of switching the RF power amplifiers 331-333 on and off with the power combiner 340 having differing turns ratios to achieve modulation. For such implementations, the multiple RF power amplifiers 330 can include ten or more RF power amplifiers 331-333. However, other implementations are possible.

In another implementation, the RF power source 400 has a two-stage amplifier (not shown) which adds a DC-DC converter (i.e. modulator) of a buck topology type, in front of the RF amplifiers 330. Multiple stages of amplification can be utilized to achieve greater power output.

Example RF Power Amplifiers

Figure 5:
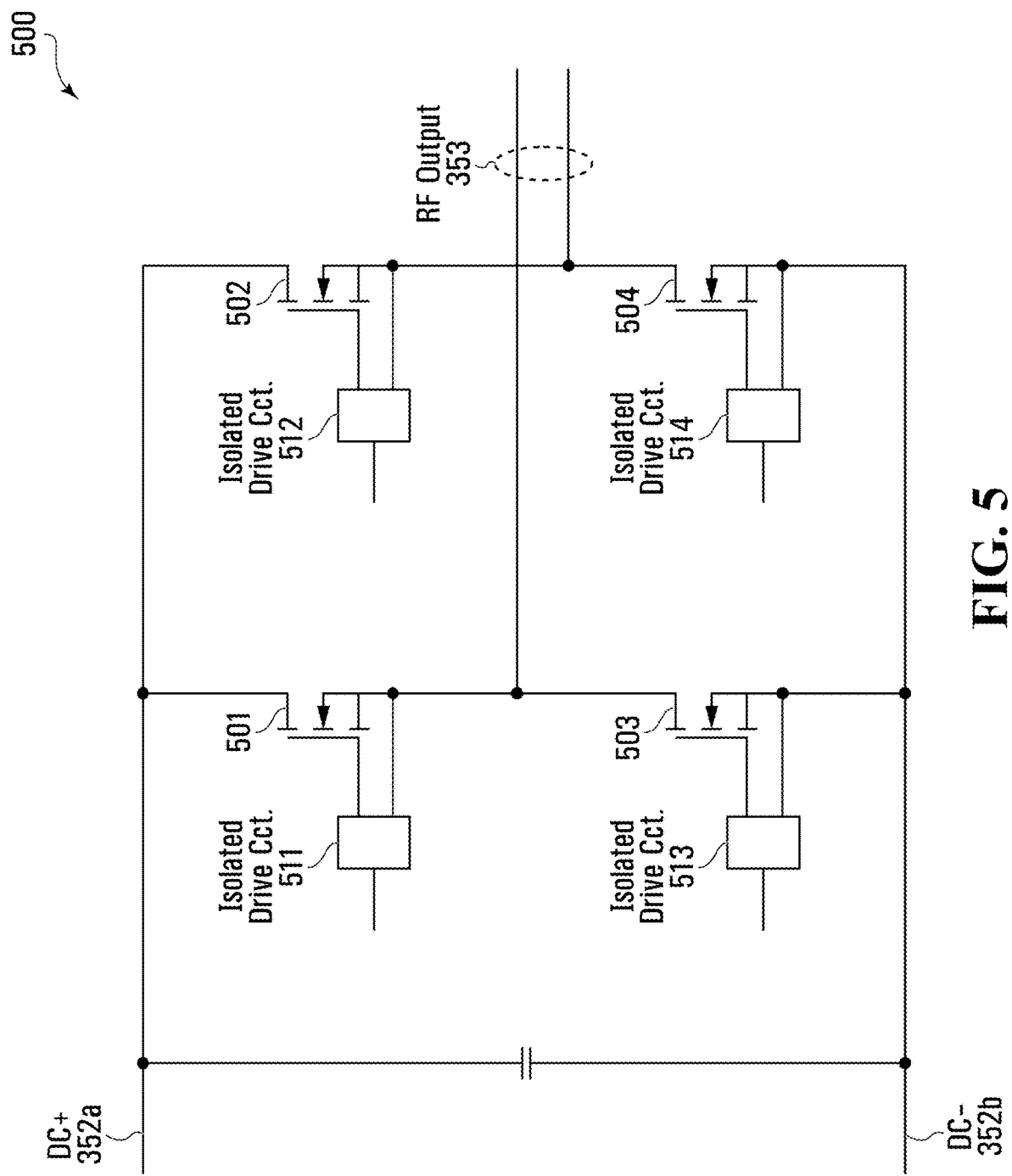
FIG. 5 is a circuit diagram of an example RF power amplifier without input to output isolation.

Referring now to FIG. 5, shown is a circuit diagram of an example RF power amplifier 500 without input to output isolation. In the illustrated example, the RF power amplifier 500 is a full bridge Class-D amplifier, which has power transistors 501-504 (e.g. MOSFETs) operating as electronic switches and not as linear gain devices as in other amplifiers. The power transistors 501-504 are controlled by control circuitry 511-514 to produce an RF output 353. Isolation circuits are used to provide protective galvanic isolation between the gate connections of the power transistors 501-504 and the control circuits operating at ground potential. Note that the power terminals (DC input 352a-352b and RF output 553) are fully isolated from ground and the control circuitry connections. However, the RF power amplifier 500 does not have galvanic isolation between the DC input 352a-352b and the RF output 553.

The RF power amplifier 500 shown in FIG. 5 has galvanic isolation between the control circuitry 511-514 and all four of the power transistors 501-504. This galvanic isolation is provided so that the RF power amplifier 500 can be used in combination with a non-isolated power supply in which its AC input terminals and DC output terminals are not galvanically isolated from each other. It is noted that with an isolated power supply, the power supply's DC− potential would normally be at ground potential which would allow the use of a non-isolated drive circuit to control the gate terminals of the transistors which have their source terminal (in the case of MOSFETs) connection to the grounded power supply connection (e.g. the DC− connection 352b in the case of FIG. 5).

The galvanic isolation between the control circuitry 511-514 and all four of the power transistors 501-504 is provided for the function of the RF power amplifier 500. Using the RF power amplifier 500 of FIG. 5 as an example, the two transistors 501-502 connected to the DC+ terminal 352a inherently have isolation to function properly because the source terminal of these RF power transistors 501-502 is at the potential of the RF output 353 and not at ground potential normally used by the control system. The insulation used to achieve isolation used in this case is referred to as 'functional insulation'. However, because the insulation used is intended to protect users who might come in contact with the RF power source, the insulation should be upgraded to a higher standard known as 'protective insulation'. The standard of insulation to protect users varies by application and may be of different grades including Reinforced, Supplementary or Double Insulation. However, in all of these grades, the standard is higher than the standard used for functional insulation as similarly discussed above for the RF generator 320 of FIGS. 3 and 4.

Figure 6:
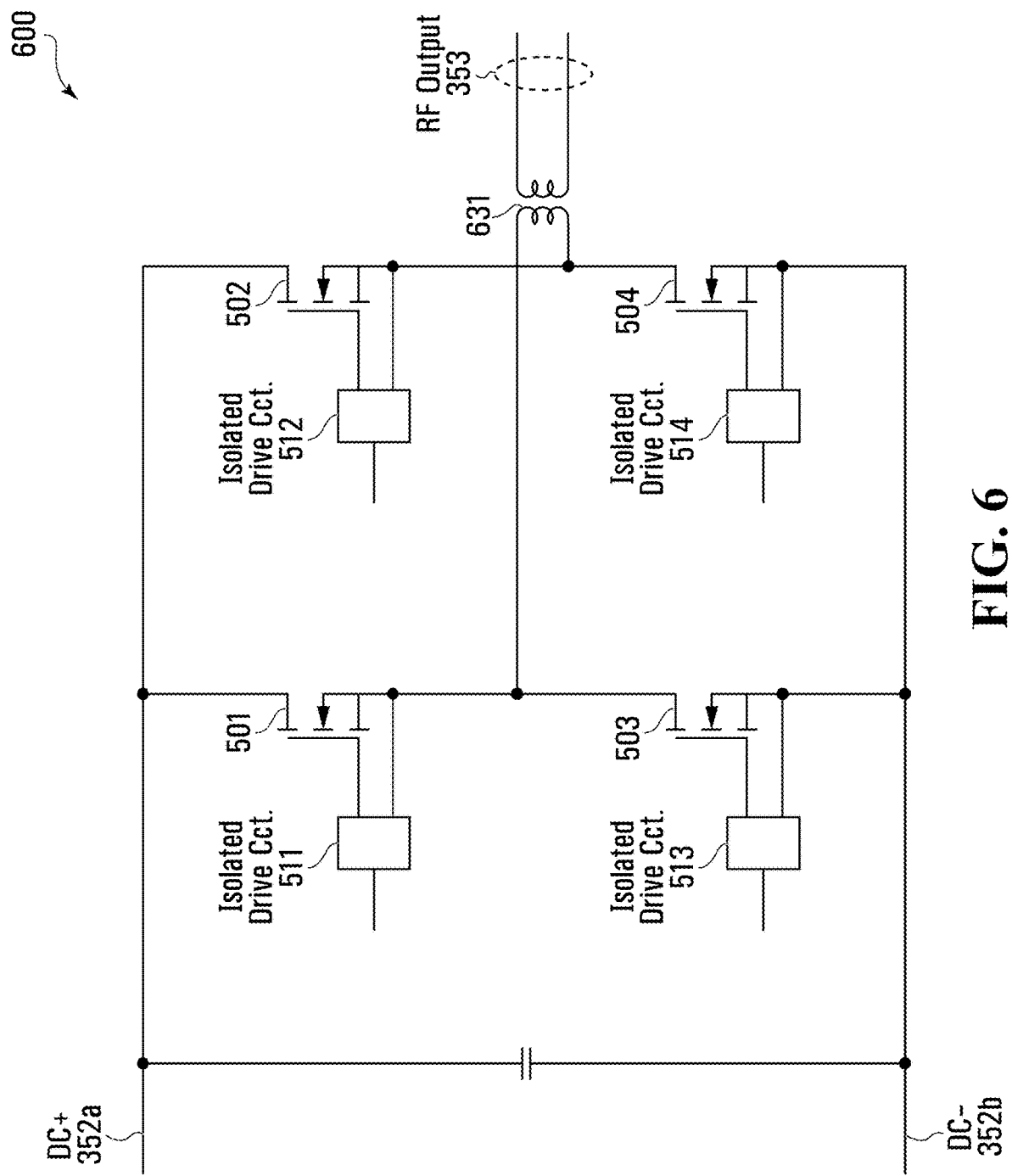
FIG. 6 is a circuit diagram of an example RF power amplifier with input to output isolation.

There are many ways to introduce galvanic isolation between the DC input 352a-352b and the RF output 353. In some implementations, galvanic isolation between the DC input 352a-352b and the RF output 353 is introduced via an internal output transformer. An example of this is shown in FIG. 6, which is a circuit diagram of an example RF power amplifier 600 with input to output isolation. The internal output transformer 631 provides isolation between a non-isolated power supply and a final output. Therefore, the RF power amplifier 600 may be used without an isolating combiner because of the built in isolation. Much like the RF power amplifier 500 of FIG. 5, the RF power amplifier 600 of FIG. 6 has isolated drive circuits 511-514 which provide isolation between the RF power amplifier 600 and the control circuitry which is usually at ground potential.

Figure 7:
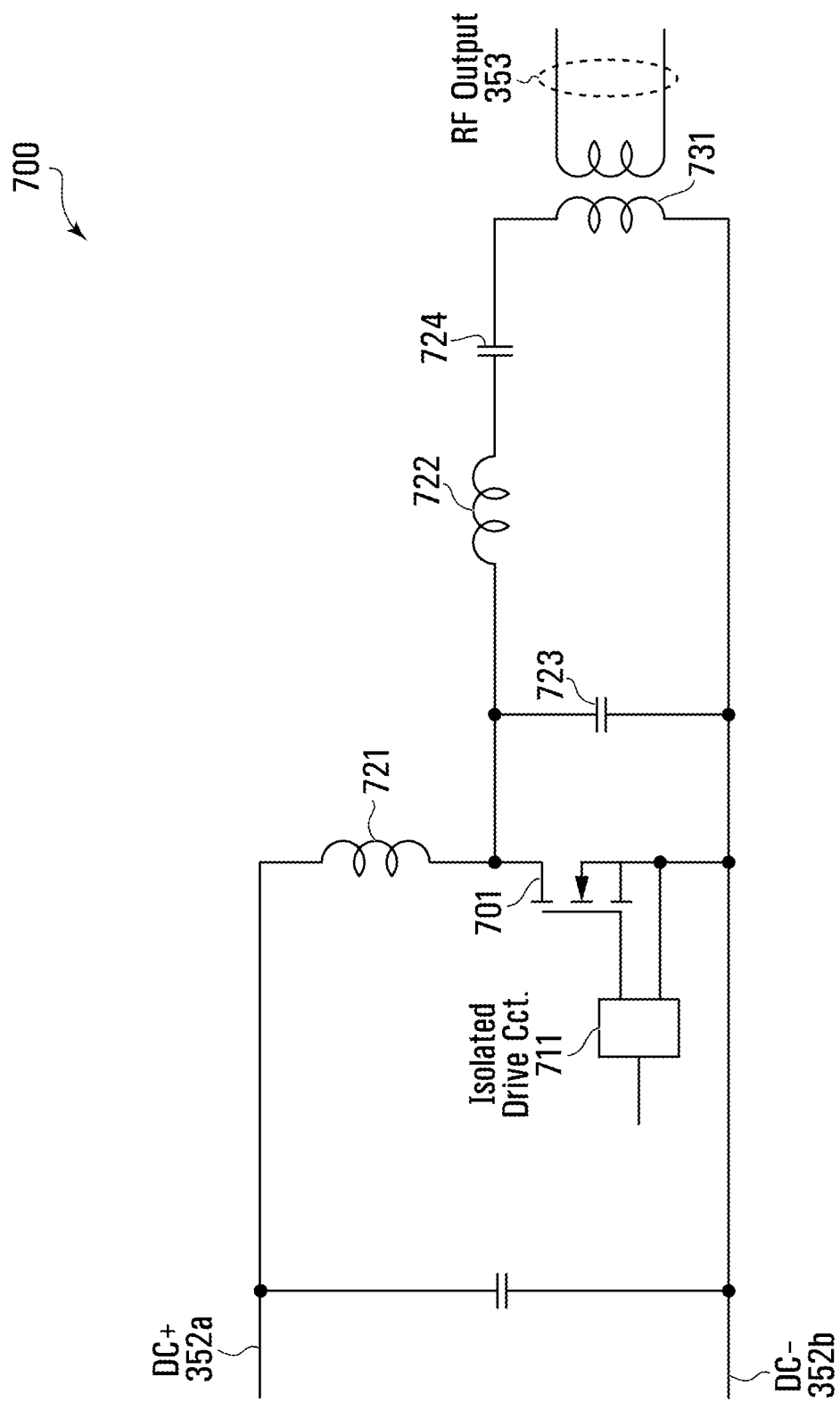
FIG. 7 is a circuit diagram of another example RF power amplifier with input to output isolation.

Referring now to FIG. 7, shown is a circuit diagram of another example RF power amplifier 700 with input to output isolation. In the illustrated example, the RF power amplifier 700 is a Class-E amplifier, which has a power transistor 701 (e.g. MOSFET) controlled by control circuitry 711 to drive a tuned reactive network 721-724 and produce an RF output 353. The tuned reactive network 721-724 can include any appropriate combination of inductors 721-722 and/or capacitors 723-724. Normally, Class-E amplifiers do not use isolated connections to the gate terminal because the MOSFET source connection is normally at ground potential. Isolation circuits are used to provide protective galvanic isolation between the gate connection of the power transistor 701 and the control circuit 711 operating at ground potential, as similarly described above for the RF power amplifier 500 of FIG. 5. Note that the power terminals (DC input 352a-352b and RF output 535) are fully isolated from ground and the control circuitry connections. Normally the DC– connection 352b would be at ground potential. In addition, the RF power amplifier 700 has galvanic isolation between the DC input 352a-352b and the RF output 353 via an internal output transformer 731. Therefore, the RF power amplifier 700 may be used without an isolating combiner because of the built in isolation.

Example Applications

There are many possible applications for the RF power source described herein. As a first example, the RF power source can be used for heating and/or drying a product as described in further detail below with reference to FIG. 8 and FIG. 9. As a second example, RF power source can be used for wireless communication as described in further detail below with reference to FIG. 10 and FIG. 11. However, it is to be understood that other applications are possible, such as producing plasma for example. The RF power source described herein can be applied in many different applications and in many different industries.

Figure 8:
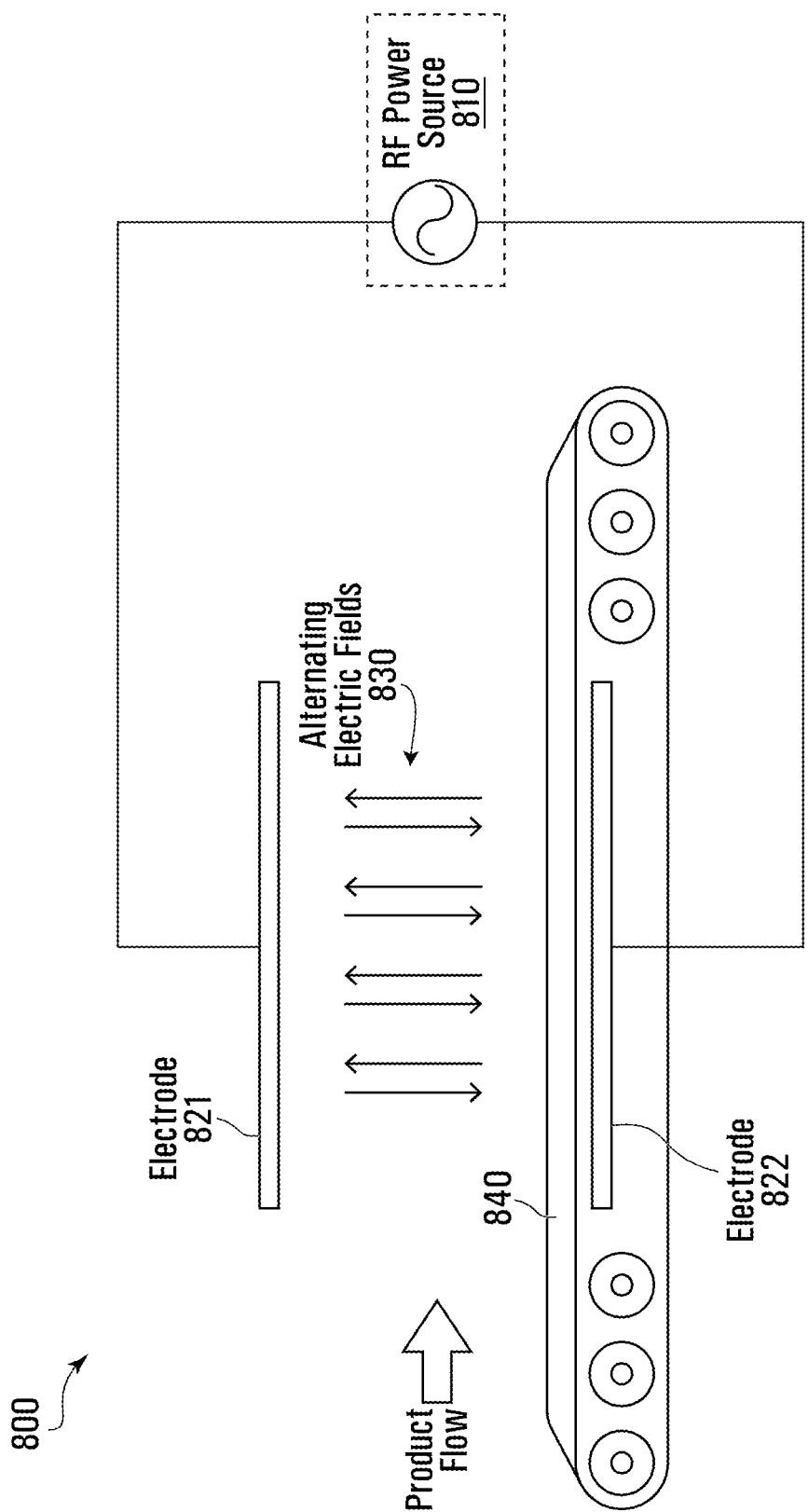
FIG. 8 is a block diagram of an example dielectric heating apparatus having an RF power source.

Referring now to FIG. 8, shown is a block diagram of an example dielectric heating apparatus 800 having an RF power source 810. The RF power source 810 is configured to generate an output RF signal as described herein. The dielectric heating apparatus 800 has a pair of electrodes 821-822 for converting the output RF signal from a voltage and current signal into an alternating electric field 830. During operation, the alternating electric field 830 is applied to a product (not shown) to heat and/or dry the product. In some implementations, as shown in the illustrated example, the product is moved between the electrodes 821-822 via a conveyor belt 840, thereby subjecting the product to the alternating electric field 830 while the product moves between the electrodes 821-822. However, other means for subjecting the product to the alternating electric field 830 are possible.

The dielectric heating apparatus 800 can be used in industrial settings. For example, the dielectric heating apparatus 800 can be used for process heating in manufacturing, particularly for bulk goods for which consistency of product is important. As a specific example, the dielectric heating apparatus 800 can be used for drying wood products. As another specific example, the dielectric heating apparatus can be used for heating food products. Other uses for the dielectric heating apparatus 800 are possible and are within the scope of the disclosure.

Figure 9:
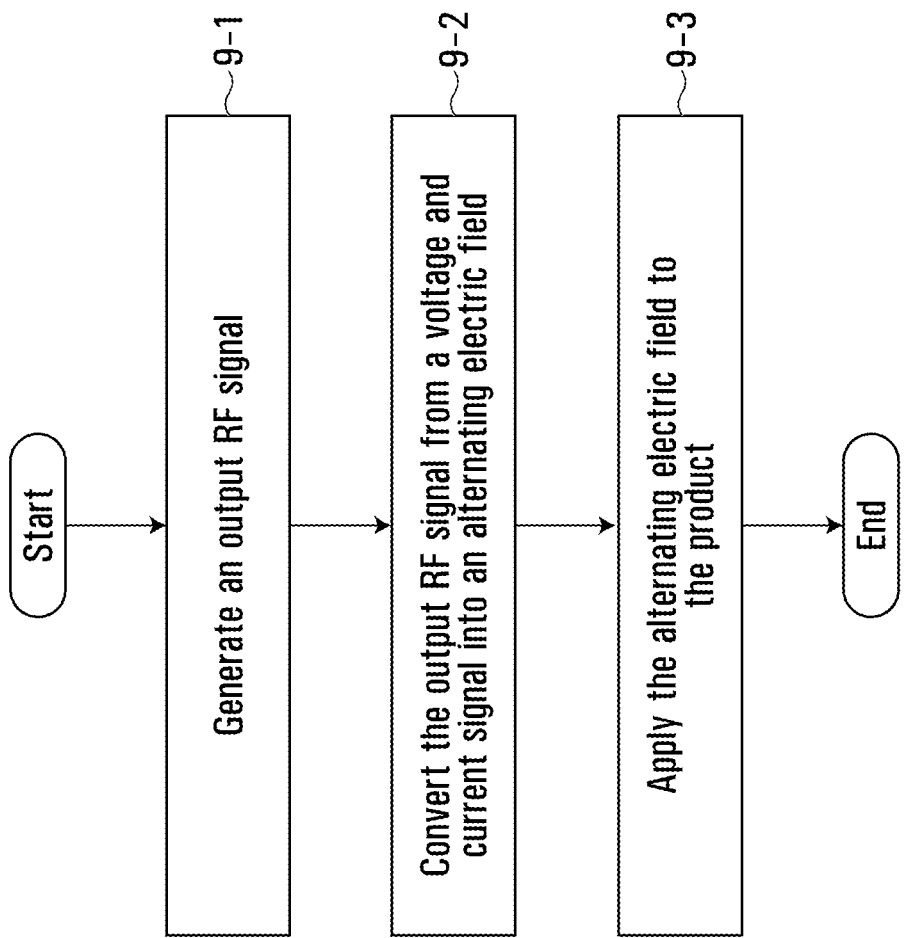
FIG. 9 is a flowchart of an example method of heating and/or drying a product.

Referring now to FIG. 9, shown is a flowchart of an example method of heating and/or drying a product. This method can be implemented by a dielectric heating apparatus, for example by the dielectric heating apparatus 800 shown in FIG. 8, or any other appropriately configured dielectric heating apparatus. At step 9-1, the dielectric heating apparatus generates an output RF signal. This can be done by using an RF power source as described herein. At step 9-2, the dielectric heating apparatus converts the output RF signal from a voltage and current signal into an alternating electric field. This can be done by using electrodes for example. Finally, at step 9-3 the dielectric heating apparatus applies the alternating electric field to the product to heat and/or dry the product.

Figure 10:
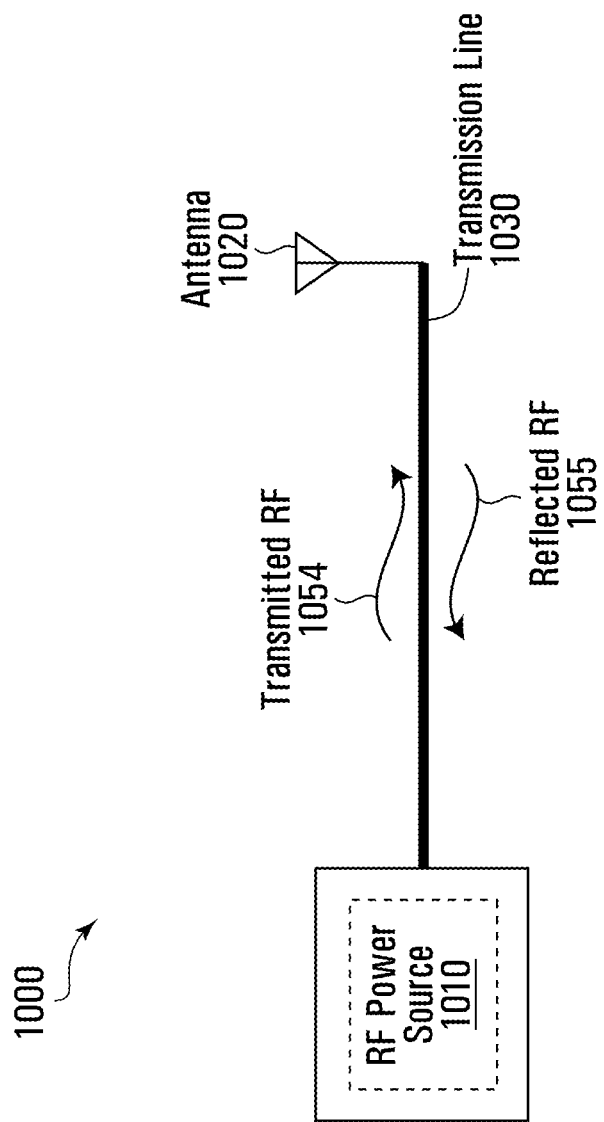
FIG. 10 is a block diagram of an example transmitting apparatus having an RF power source.

Referring now to FIG. 10, shown is a block diagram of an example transmitting apparatus 1000 having an RF power source 1010. The RF power source 1010 is configured to generate an output RF signal 1054 as described herein. The transmitting apparatus 1000 has an antenna 1020 coupled to the RF power source 1010 for converting the output RF signal 1054 from a voltage and current signal into an electromagnetic wave for transmission over a wireless channel. In some implementations, as shown in the illustrated example, the antenna 1020 is coupled to the RF power source 1010 via a transmission line 1030. Some amount of reflected signal 1055 is possible. In most relevant high power implementations, the antenna 1020 and the RF power source 1010 are physically separated, and hence the transmission line 1030 is utilized to connect the antenna 1020 to the RF power source 1010. However, in other implementations, there is no transmission line 1030.

Figure 11:
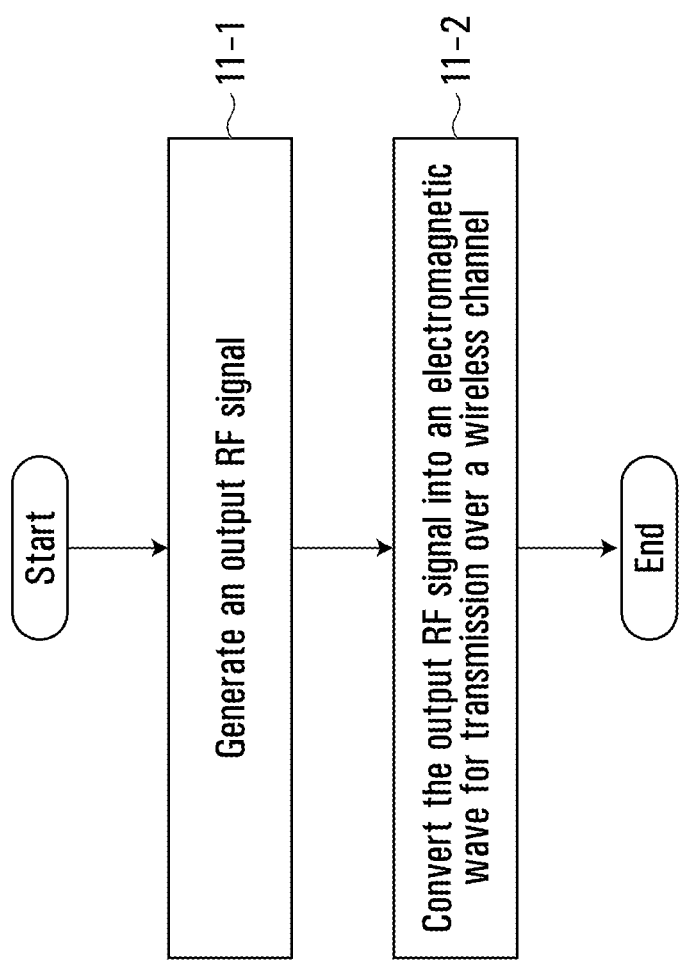
FIG. 11 is a flowchart of an example method of wireless communication.

Referring now to FIG. 11, shown is a flowchart of an example method of wireless communication. This method can be implemented by a transmitting apparatus, for example by the transmitting apparatus 1000 shown in FIG. 10, or any other appropriately configured transmitting apparatus. At step 11-1, the transmitting apparatus generates an output RF signal. This can be done by using an RF power source as described herein. At step 11-2, the transmitting apparatus converts the output RF signal from a voltage and current signal into an electromagnetic wave for transmission over a wireless channel. This can be done by using an antenna for example. In some implementations, the RF power source is connected to a transmission line terminated with the antenna to produce the electromagnetic wave.

Numerous modifications and variations of the present disclosure are possible in light of the above teachings. It is therefore to be understood that within the scope of the appended claims, the disclosure may be practised otherwise than as specifically described herein.

We claim:

1. An RF (Radio Frequency) power source, comprising:
   a power supply configured to convert an AC (Alternating Current) voltage at a power supply input to a second voltage at a power supply output, without galvanic isolation between the power supply input and the power supply output; and
   an RF generator configured to receive the second voltage at an RF generator input and to use the second voltage to produce an output RF signal at an RF generator output, with galvanic isolation between the RF generator input and the RF generator output;
   wherein the RF generator comprises a plurality of RF power amplifiers each configured to use the second voltage to produce an individual RF signal, and a power combiner configured to combine each individual RF signal to produce the output RF signal.

2. The RF power source of claim 1, wherein the AC voltage comprises a three-phase AC voltage, the second voltage comprises a DC (Direct Current) voltage, and the power supply comprises a rectifier circuit for converting the three-phase AC voltage to the DC voltage.

3. The RF power source of claim 2, wherein the rectifier circuit comprises a six-pulse rectifier.

4. The RF power source of claim 2, wherein the rectifier circuit comprises a diode rectifier.

5. The RF power source of claim 1, wherein the power supply further comprises a filter configured to reduce ripple voltage.

6. The RF power source of claim 1, wherein the galvanic isolation between the RF generator input and the RF generator output is provided by the power combiner comprising an isolated combiner.

7. The RF power source of claim 6, wherein the isolated combiner comprises a plurality of RF transformers to combine power of the RF power amplifiers while providing galvanic isolation between the RF generator input and the RF generator output.

8. The RF power source of claim 7, wherein the isolated combiner comprises, for each RF power amplifier, a corresponding RF transformer of the plurality of RF transformers for receiving the individual RF signal from the RF power amplifier, such that a series connection of the plurality of RF transformers combines the individual RF signals to produce the output RF signal.

9. The RF power source of claim 6, wherein the isolated combiner provides protective insulation that goes beyond functional insulation.

10. The RF power source of claim 1, wherein the galvanic isolation between the RF generator input and the RF generator output is provided by each RF power amplifier comprising an isolated RF power amplifier.

11. The RF power source of claim 10, wherein the isolated RF power amplifier comprises a full bridge Class-D amplifier with an internal output transformer to provide the galvanic isolation.

12. The RF power source of claim 10, wherein the isolated RF power amplifier comprises a Class-E amplifier with an internal output transformer to provide the galvanic isolation.

13. The RF power source of claim 10, wherein each isolated RF power amplifier provides protective insulation that goes beyond functional insulation.

14. The RF power source of claim 1, wherein the galvanic isolation between the RF generator input and the RF generator output is provided by both (i) the power combiner comprising an isolated combiner and (ii) each RF power amplifier comprising an isolated RF power amplifier.

15. The RF power source of claim 1, wherein the plurality of RF power amplifiers comprises eight RF power amplifiers.

16. The RF power source of claim 1, comprising control circuitry to individually enable or disable each RF power amplifier.

17. A dielectric heating apparatus comprising the RF power source of claim 1 for producing the output RF signal, and a pair of electrodes coupled to the RF power source for converting the output RF signal from a voltage and current signal into an alternating electric field.

18. A method of heating and/or drying a product, comprising:
   generating an output RF signal using the RF power source of claim 1;
   converting the output RF signal from a voltage and current signal into an alternating electric field; and
   applying the alternating electric field to the product to heat and/or dry the product.

19. A transmitting apparatus comprising the RF power source of claim 1 for producing the output RF signal, and an antenna coupled to the RF power source for converting the output RF signal from a voltage and current signal into an electromagnetic wave for transmission over a wireless channel.

20. A method of wireless communication, comprising:
   generating an output RF signal using the RF power source of claim 1; and
   converting the output RF signal from a voltage and current signal into an electromagnetic wave for transmission over a wireless channel.

* * * * *